US006747793B1

(12) United States Patent
Flanders

(10) Patent No.: US 6,747,793 B1
(45) Date of Patent: Jun. 8, 2004

(54) SYSTEM WITH INTEGRATED SEMICONDUCTOR OPTICAL AMPLIFIER ARRAY AND SWITCHING MATRIX

(75) Inventor: Dale C. Flanders, Lexington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 0 days.

(21) Appl. No.: 09/712,074

(22) Filed: Nov. 14, 2000

Related U.S. Application Data

(60) Provisional application No. 60/165,431, filed on Nov. 15, 1999.

(51) Int. Cl.[7] .................................. H01S 3/00
(52) U.S. Cl. .................. 359/344; 359/341.32; 359/349; 385/16; 385/17; 385/14; 385/39; 385/73
(58) Field of Search ................ 359/117, 118, 359/128, 168, 174, 179, 341.1, 341.32, 344, 349; 385/16, 17, 31, 33, 39, 50, 70, 71, 73, 14

(56) References Cited

U.S. PATENT DOCUMENTS

| | | | | |
|---|---|---|---|---|
| 4,736,164 A | * | 4/1988 | Henning | 330/4.3 |
| 4,886,334 A | * | 12/1989 | Aoki | 350/96.15 |
| 4,932,745 A | * | 6/1990 | Blonder | 350/96.2 |
| 5,024,504 A | | 6/1991 | Boudreau et al. | 350/96.18 |
| 5,282,080 A | | 1/1994 | Scifres et al. | 359/344 |
| 5,414,554 A | * | 5/1995 | Aoyama | 359/344 |
| 5,528,724 A | * | 6/1996 | Chang | 385/137 |
| 5,715,340 A | * | 2/1998 | Sasagawa | 385/33 |
| 5,740,293 A | | 4/1998 | Van Roemburg et al. | 385/92 |
| 5,796,889 A | * | 8/1998 | Xu | 385/24 |
| 5,838,488 A | * | 11/1998 | Kobayashi | 359/341 |
| 5,889,904 A | * | 3/1999 | Pan | 385/24 |
| 5,943,454 A | * | 8/1999 | Aksyuk | 385/22 |
| 5,953,467 A | * | 9/1999 | Madsen | 385/15 |
| 6,049,641 A | * | 4/2000 | Deacon et al. | 385/15 |
| 6,069,732 A | * | 5/2000 | Koch | 359/344 |
| 6,084,994 A | * | 7/2000 | Li | 385/31 |
| 6,115,517 A | * | 9/2000 | Shiragaki | 385/24 |
| 6,181,850 B1 | * | 1/2001 | Nakamura | 385/33 |
| 6,238,100 B1 | * | 5/2001 | Sasaki | 385/59 |
| 6,256,430 B1 | * | 7/2001 | Jin | 385/18 |
| 6,289,152 B1 | * | 9/2001 | Zhang | 385/33 |

FOREIGN PATENT DOCUMENTS

| | | | | |
|---|---|---|---|---|
| EP | 0 593 237 A2 | 4/1994 | | H01S/3/25 |
| EP | 0 935 149 A2 | 8/1999 | | G02B/6/42 |
| WO | 98/19409 | 5/1998 | | |

OTHER PUBLICATIONS

Chen, C.-H. et al. "Semiconductor Opticla Amplifier Array Coupled to Uncoated Flat–End Fibers with Integrated Beam Expanders and TiO2 Antireflection Coatings." IEEE J. Selected Topics in Quantum Electronics, 3:6, Dec. 1997, pp. 1421–1428.*

Oh, K. R., et al. "Optical Devices Integrated with Semicondutor Optical Amplifier." CLEO, Pacific Rim '99, Sep. 1999. pp. 1083–1084.*

Sasaki, J. et al. "Hybrid Integrated 4x4 optical matrix switch using self–aligned semiconductor optical amplifier gate switch arrays and silica planar lightwave circuit." Elect. Lett. May 1998. Vol. 34, No. 10, pp. 986–987.*

(List continued on next page.)

*Primary Examiner*—Thomas G. Black
*Assistant Examiner*—Stephen Cunningham
(74) *Attorney, Agent, or Firm*—J. Grant Houston

(57) ABSTRACT

An optical amplifier array is integrated with a switching matrix with a tunable filter. As a result, switching and amplification can be performed in a common hermetic package, for example, thus offering advantages associated with small footprint and low cost. The optional integration of the tunable filter, with or without the switching matrix, further allows for the monitoring of the separate optical links to ensure the proper routing of signals and/or proper spectral slotting of the various channels in each of the WDM optical signals.

11 Claims, 3 Drawing Sheets

OTHER PUBLICATIONS

Maeno, Y. et al. "A 2.56–Tb/s Multiwavelength and Scalable Switch–Fabric for Fast Packet Switching Networks." IEEE Photonics Tech. Lett. Vol. 10, No. 8, Aug. 1998. Pp. 1180–1182.*

Grard, E. et al. "High Performance Packaging Technique Used for Clamped Gain Semiconductor Optical Amplifier Array Modules Fabrication." 1998 Electronic Components and Technology Conference, pp. 1270–1273.*

Patel, R.H. et al. "Compact, Low–Crosstalk, WDM Filter Elements for Multimode Ribbon Fiber Data Links." 1999 Electronic Components and Technology Conference. Pp. 1261–1264.*

Almstrom, E. et al. "Experimental and Analytical Evaluation of Packaged 4×4 InGaAsP/InP Semiconductor Optical Amplifier Gate Switch Matricies for Optical Networks." J. Lightwave Tech. vol. 14, No. 6, Jun. 1996.*

Fish, G.A. et al. "Optical Crossbar Switches on InP." LEOS 1999. Nov. 1999. Pp. 405–406.*

Chen, C.–H. "Semiconductor Optical Amplifier Array Coupled to Uncoated Flat–End Fibers with Integrated Beam Expanders an TiO2 Antireflection Coatings." IEEE J. Selected Topics in Quantum Elect. vol. 3, No. 6, Dec. 1997. Pp. 1421–1428.*

Hunziker, W. et al. "Self–Aligned Filp–chip packaging of tilted semiconductor optical amplifier arrays on Si motherboard." Elect Lett., vol. 31, No. 6. Mar. 1995. Pp. 488–490.*

Fujiwara et al. "Studies on Semiconductor Optical Amplifiers for Line Capacity Expansion in Photonic Space–Division Switching System." J. Lightwave Tech. 9:2, Feb. 1991, pp. 155–160.*

Novotny, R.A.; Wojcik, M.J.; Beckman, M.G.; Hinterlong, S.J.; and Lentine, A.L., "Two Dimensional Optical Data Links," Proceedings of the Electronic Components and Technology Conference, Jun. 1–4, 1993, Orlando, Florida.

* cited by examiner

SYSTEM WITH INTEGRATED SEMICONDUCTOR OPTICAL AMPLIFIER ARRAY AND SWITCHING MATRIX

RELATED APPLICATION

This application claims the benefit of the filing date of U.S. Provisional Application No. 60/165,431, filed Nov. 15, 1999, the teachings of which are incorporated herein by this reference in their entirety.

BACKGROUND OF THE INVENTION

Today, the most common modality for optical signal amplification is the rare-earth doped fiber amplifier. These devices have good amplification characteristics and a well-understood long-term behavior. Moreover, they can be added to a fiber link via fiber splicing, which is a low insertion loss coupling technique.

An alternative amplification modality is the semiconductor optical amplifier (SOA). SOA systems have a number of advantages relative to the common erbium-doped amplifier scheme. SOA's are typically electrically, rather than optically, pumped. As a result, they can be more efficient and avoid the need for ancillary, expensive optical pump devices. Moreover, they are usually physically smaller than fiber amplifiers, which require a relatively long length of doped fiber. This last characteristic is especially relevant when amplification is required in larger systems offering higher levels of functionality.

For example, integrated switching and amplification capabilities are relevant to optical applications such as metro WDM. In such applications, the dynamic routing of individual wavelength slots or channels to form multichannel wavelength division multiplexed (WDM) optical signals is important functionality, especially if it can be provided in small, low-cost systems.

SUMMARY OF THE INVENTION

The present invention concerns an optical amplifier array that is integrated with a switching matrix. Further, in a preferred embodiment, a tunable filter is further integrated into the system. As a result, switching and amplification can be performed in a common hermetic package, for example, thus offering advantages associated with small footprint and low cost. The optional integration of the tunable filter, with or without the switching matrix, further allows for the monitoring of the separate optical links to ensure the proper routing of signals and/or proper spectral slotting of the various channels in each of the WDM optical signals.

In general, according to one aspect, the invention features a multi-channel semiconductor optical amplifier system. The system comprises an optical bench. A first array and second array of fibers, having endfaces, are secured relative to the optical bench. A semiconductor optical amplifier array is installed optically between the endfaces of the first array and the endfaces of the second array to provide for optical amplification of optical signals being transmitted between the two arrays.

In the illustrated embodiment, the optical amplifier array is implemented as separate semiconductor chips. Alternatively, multi-striped chips can be utilized providing for further integration.

In the preferred embodiment, an isolator is installed on the optical bench between the endfaces of the first fiber array and the semiconductor optical amplifier array. Such isolators are useful to prevent the SOA's from lasing on any back-reflected signals.

Typically, in the preferred embodiment, two isolator systems are used, one between the first array and the SOA's and a second between the SOA's and the second array. Collimating lenses are typically required and are installed on the optical benches to couple light, from the first fiber array, into the semiconductor optical amplifier array.

Preferably, to provide for WDM monitoring, a tunable filter is installed on the bench to provide for the spectral analysis or filtering of optical signals from the first array of fibers. A detector is used to then detect the filtered optical signal. Further, to allow the filter to sample any one of the beams from the first array of fibers, an array of filter optical switches is provided that selectively transmits optical signals from one of the fibers in the first array to the tunable filter.

In general, according to another aspect, the invention further features a multi-channel semiconductor switch system with optical amplification. This system comprises an optical bench and first, second, and third arrays of fibers, having endfaces that are secured relative to the optical bench. In one embodiment, the first array of fibers functions as an input port and the second and third arrays function as output ports.

In order to provide for the switching functionality, an array of optical switches is located between the first array of fibers and the second and third array of fibers. These switches allow beams emitted from the first array of fibers to be selectively coupled to either the second or third array of fibers.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
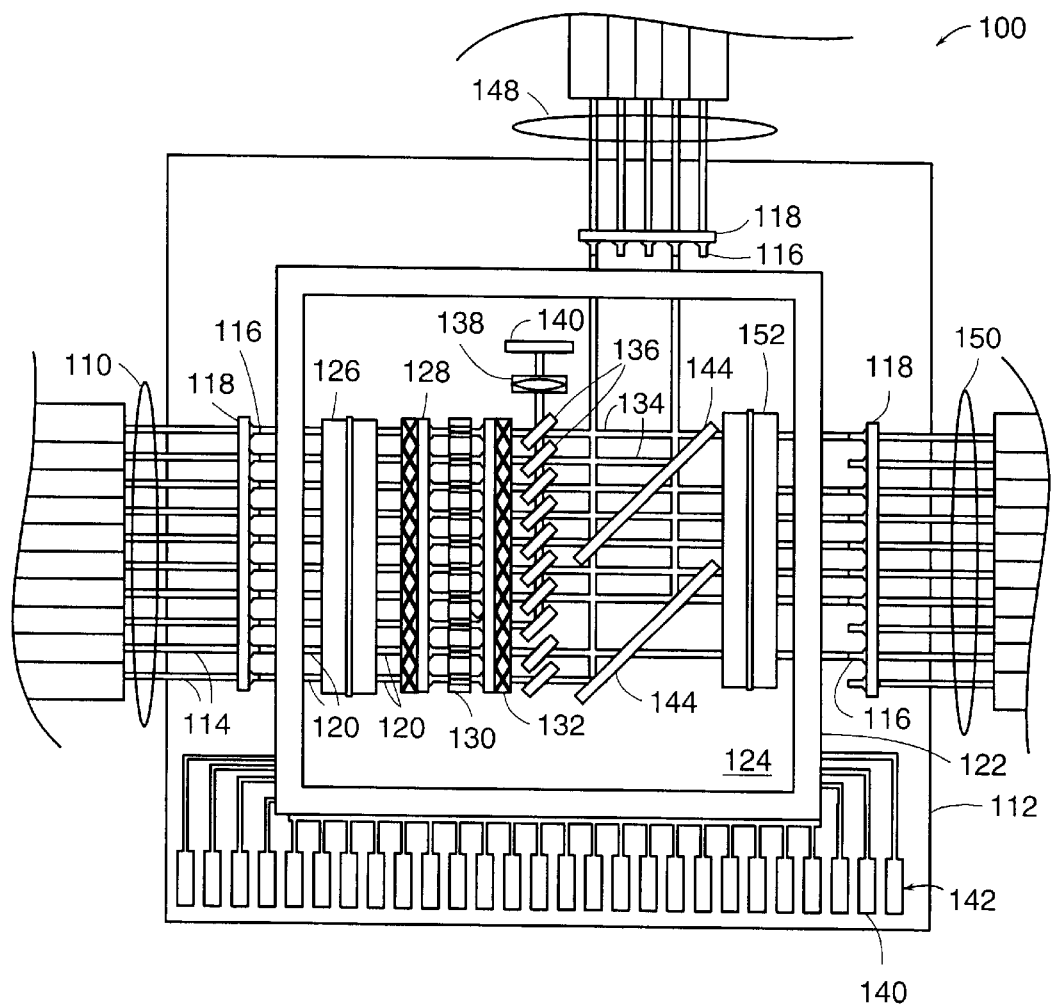
FIG. 1 is a top plan view of the multi-channel semiconductor switch system with optical amplification according to the present invention.

FIG. 1 shows the optical signal switching system with semiconductor optical amplification 100, which system has been constructed according to the principles of the present invention.

Specifically, a first array of fibers 110 is secured to the substrate or optical bench 112 of the system 100. In the specific implementation illustrated, the first array of fibers comprises ten separate optical fibers 114. Each one of these fibers has an endface 116 that is secured to the bench 112 via a first fiber mounting structure 118. In more detail, each one of the separate fibers projects through a port in the fiber mounting structure 118 such that its endface 116 is held in a fixed relationship to the optical bench 112. In one implementation, this endface comprises a fiber lens to improve the collimation of light emitted from the respective fiber. The beams 120 that are emitted from the endfaces 116 of the fibers 114 are transmitted through a hermetic package sidewall 122 into the hermetic region 124 of the system 100.

In the illustrated embodiment, the beams enter a first optical component, which is a first or input-side isolator system 126. This isolator system prevents backreflections into the fiber endfaces but also backreflections into the subsequent SOA's to prevent lasing.

The beams 120 emitted from the first isolator system 126 enter a collimator lens array 128. This collimator lens array comprises, in the preferred or current embodiment, separate discrete lenses formed using the mass transport lens process as described in, for example, U.S. Pat. No. 5,618,474, the teachings of which are incorporated herein by this reference in their entirety. These separate lenses of the lens array 128, focus the beams 120 so that they are coupled into a semiconductor optical amplifier array 130.

The optical amplifier array 130, in one embodiment, comprises a single, multi-striped chip. In the illustrated embodiment, however, it comprises separated, singulated semiconductor optical amplifier (SOA) chips installed on a common pedestal such that they are aligned with the optical axes of the beams 120.

The diverging beams emitted from the SOA array are recollimated by a second collimator array 132. This collimator array, again, comprises separate discrete lenses, in the preferred embodiment, which convert the generally diverging beams from the chips to more collimated beams, typically having a waist.

The amplified optical signal beams 134 that are emitted from the SOA chips 130 first pass through an array of optical filter switches 136. In the illustrated embodiment, these switches are aligned in a row that is parallel to a surface of the bench 112, but extends orthogonally to the axes of the separate amplified beams 134. Typically, in the illustrated embodiment, the individual switches of the filter switch array 136 are "rollershade" switches as described in U.S. Pat. No. 5,784,189, for example. This configuration, however, is simply the illustrated implementation. The present invention is compatible with other switch configurations.

The array of optical filter switches functions to divert one of the amplified beams 134 to a tunable filter 138. In the preferred embodiment, this tunable filter 138 bandpass filters the signal with a tunable passband so that it can assess the optical power in a single optical channel slot in a WDM signal of one of the beams 134. In one implementation, this tunable filter 138 is a MOEMS (micro optical electromechanical system) device, such as described in U.S. patent application Ser. No. 09/649,168, filed on Aug. 25, 2000, entitled Tunable Fabry-Perot Filter, by Flanders, et al., the teachings of which are incorporated herein by this reference in their entirety, although other MOEMS tunable filters, filters based on other technologies, can be used.

In any case, to be compatible with modern WDM channel spacings, the passband of the tunable filter is preferably less than 100 GigaHertz (GHz) to be compatible with the promulgated ITU grid. In still another embodiment, the bandwidth of the passband is less than 50 GHz to be compatible with the 50 gigahertz offset on the ITU grid.

A photodiode 140 detects the filtered optical signal from the tunable filter 138 to convert it to a signal that can be accessed outside the hermetic closure 122 on the bench 112 via one of the bond pads 140 in the bond pad array 142. Further, the photodiode can be used as a feedback system to control the gain or electrical power that is provided to the individual SOA's to control WDM signal amplification.

In the illustrated embodiment, after being transmitted through the optical filter switch array 136, the amplified optical signals 134 reach an optical port switch array 144.

The optical port switches 144 function to divert the amplified beams 134 to either a first output port comprising a second optical fiber array 148 or a second optical port comprising a third optical fiber array 150.

In the illustrated embodiment, the optical port switches comprise rollershade switches that in an unactuated or inactivated state create an open port through which the amplified beams pass to the second output port and the third array of optical fibers 150 or in an actuated state function as reflectors that divert the beams to the first output port and the second array of fibers 148.

In the preferred embodiment, there is a second isolator system 152 on the path to the second output port. In another embodiment, a third isolator system, not shown, is placed between the second output port and the port switches 144. In still another embodiment, an isolator system is located optically after the second collimator array 132 and optically before any of the switches to prevent back reflections into the SOA's. This last configuration avoids the need for duplicate isolator arrays for each output port.

As described previously, each of the separate fibers of the second and third fiber arrays 148, 150 is secured to the bench via respective fiber mounting structures 118. These hold the endfaces 116 of the fibers so that the beams can be coupled into the fibers. In one implementation, these output fibers have fiber lenses to improve coupling efficiency.

Figure 2:
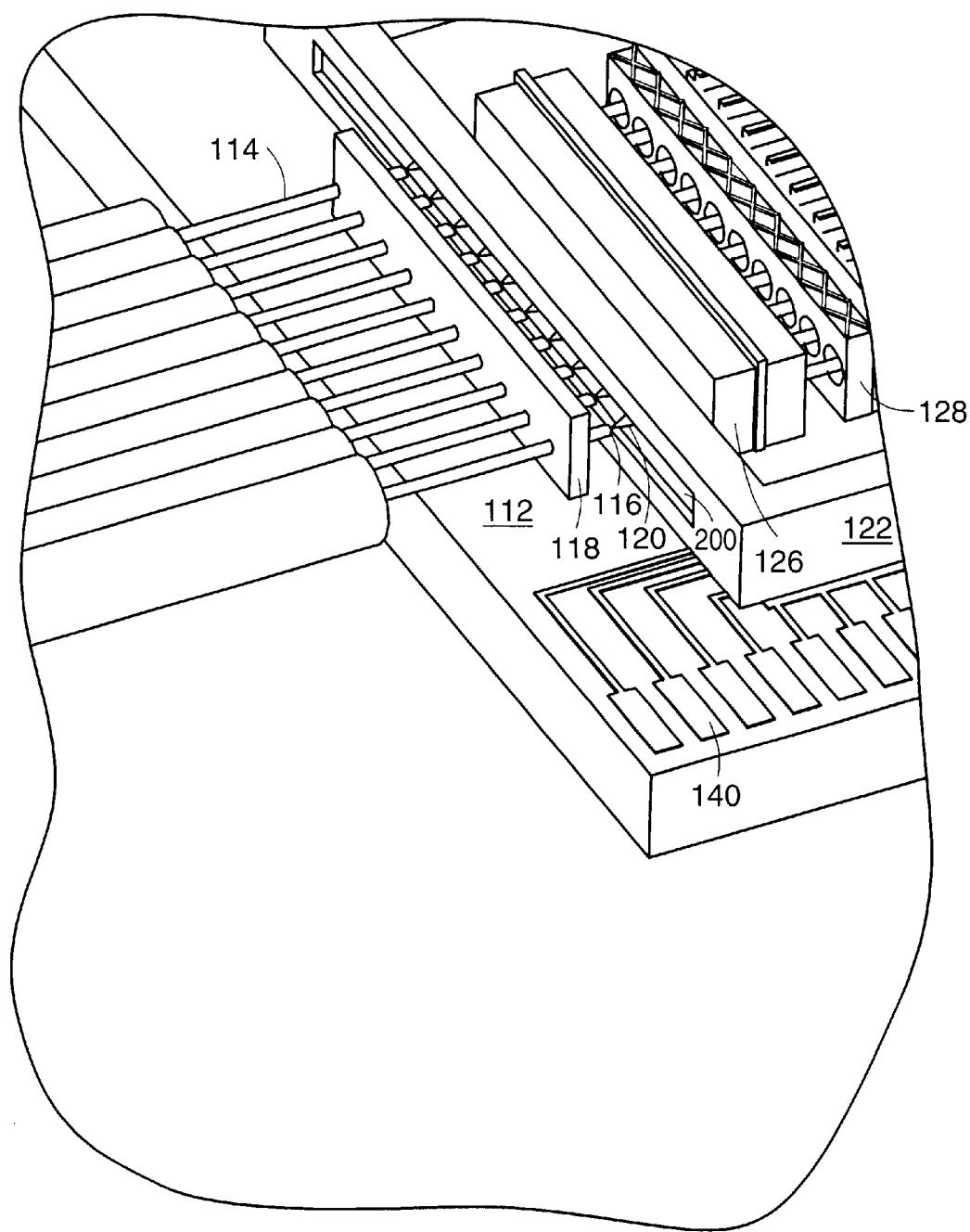
FIG. 2 is a perspective view illustrating the details of the beam coupling into and out of the systems and the isolation and collimation components, according to the present invention.

FIG. 2 shows a close up of the fiber mounting structure 118 on one of the ports. Typically, the separate fibers are secured to the mounting structure, which is in turn secured to the surface of the bench 112. In the preferred embodiment, the fiber endfaces terminate in a nonhermetically sealed portion of the bench. Specifically, the beams 120 pass through a window structure or beam feedthrough in a sidewall of the hermetic package 122. This has an advantage in that organic and/or epoxy compounds can be used to secure the fibers 114 to the mounting structure 118 without prejudicing the operation of the active components within the hermetic package 122 via facet contamination by carbon, for example.

Figure 3:
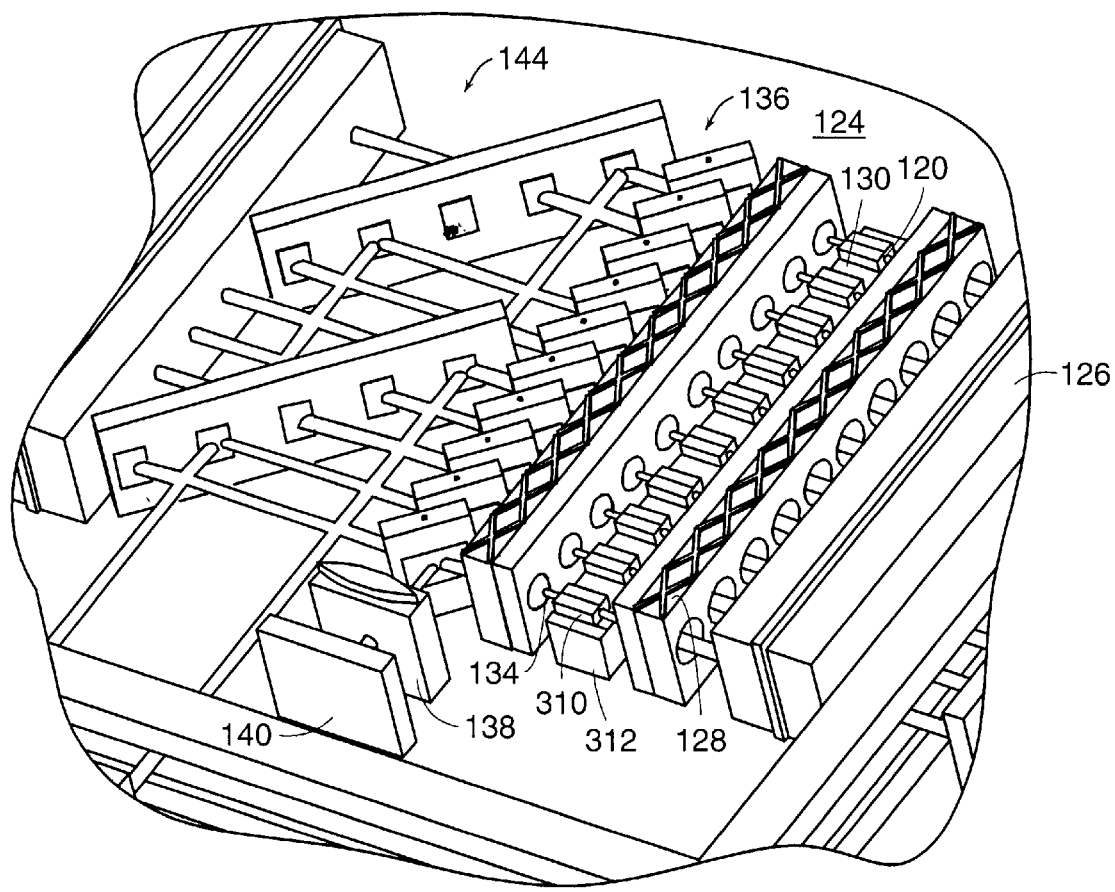
FIG. 3 is a reverse angle view showing the SOA chips, collimating optics and the array of optical port switches.

FIG. 3 is a reverse angle view showing the specifics of the semiconductor optical amplifier array 130. Typically, the array comprises a series of separate chips 310, which are secured to a pedestal structure 312. Beams 120 are coupled into input facets of the chips 310 by the first collimator array 128. The amplified beams 134 are typically diverging and are thus recollimated by the second collimator array 132.

Also shown are the specifics of the filter switch array 136. Specifically, in the specific illustrated implementation, separate roller shade structures are attached in an orthogonal fashion to the surface of the bench 124. They function to either reflect or transmit the beams. In a reflecting configuration, one of the beams is transmitted to the tunable filter 138 and the filtered beam is then detected by the photodetector 140. This tunable filter is used in some cases for perform a channel inventory of the WDM signal or determine the total power of the WDM signal or assess gain tilt, for example.

Finally, the specifics of the port switch arrays 144 are shown. Specifically, in the illustrated embodiment, these switches comprise multiple switching elements installed on a common substrate. Specifically, two separate substrates are used, each with five switch elements. These specific switch configurations function to either transmit or reflect the amplified beams such that they are coupled into either the first or second output ports.

While this invention has been particularly shown and described with references to preferred embodiments thereof, it will be understood by those skilled in the art that various changes in form and details may be made therein without departing from the scope of the invention encompassed by the appended claims.

What is claimed is:

1. A multichannel semiconductor optical amplifier system, comprising:
   an optical bench,
   first array of fibers having endfaces secured relative to the optical bench;
   a second array of fibers having endfaces secured relative to the optical bench;
   a third array of fibers having endfaces secured relative to the optical bench;
   a semiconductor optical amplifier array installed on the optical bench and optically between the endfaces of the first array of fibers and the endfaces of the second and third arrays of fibers; and
   an array of port optical switches on the optical bench for providing selected optical signals from the first array of fibers to either the second array of fibers or the third array of fibers.

2. A multichannel switch system with semiconductor optical amplification, the system comprising:
   an optical bench;
   a first array of fibers having endfaces secured relative to the optical bench;
   a second array of fibers having endfaces secured relative to the optical bench;
   a third array of fibers having endfaces secured relative to the optical bench;
   an array of optical port switches, on the optical bench, for providing optical signals from the first array of fibers to either the second array of fibers or the third array of fibers; and
   a semiconductor optical amplifier array installed optically between the endfaces of the first array of fibers and the endfaces of the second and third array of fibers, on the optical bench, to amplify optical signals transmitted between the endfaces of the first array of fibers and the endfaces of the second and third array of fibers.

3. A system as claimed in claim 2, wherein the first array of fibers functions as an input port to the system.

4. A system as claimed in claim 2, wherein the second array of fibers functions as a first output port to the system.

5. A system as claimed in claim 4, wherein the third array of fibers functions as a second output port of the system.

6. A system as claimed in claim 2, wherein the semiconductor optical amplifier array comprises separate semiconductor chips.

7. A system as claimed in claim 2, further comprising an isolator system installed on the optical bench between the endfaces of the first array of fibers and the semiconductor optical amplifier array.

8. A system as claimed in claim 2, further comprising:
   a first isolator system installed on the optical bench optically between the endfaces of the first array of fibers and the semiconductor optical amplifier array; and
   a second isolator system installed on the optical bench optically between the semiconductor optical amplifier array and the endfaces of the second array of fibers.

9. A system as claimed in claim 2, further comprising collimating lenses installed on the optical bench between the endfaces of the first array of fibers and the semiconductor optical amplifier array to couple light emitted from the endfaces into the semiconductor optical amplifier array.

10. A system as claimed in claim 8, comprising:
    a tunable filter for spectrally analyzing the optical signals from the first array of fibers;
    a detector for detecting a filtered optical signal from the tunable filter; and
    an array of optical filter switches for providing selected optical signal from the first array of fibers to the tunable filter.

11. a multichannel semiconductor optical amplifier system, comprising:
    an optical bench;
    a first array of optical ports to the optical bench;
    a second array of optical ports to the optical bench;
    a third array of optical ports to the optical bench;
    a semiconductor optical amplifier array installed on the optical bench and optically between the first array of optical ports and the second and third arrays of optical ports; and
    an array of port optical switches on the optical bench for providing selected optical signals from the first array of optical ports to either the second array of optical ports or the third array of optical ports;
    wherein the optical signals are transmitted between the ports to the switches and amplifiers via free space optical links.

* * * * *